(12) United States Patent
Ito et al.

(10) Patent No.: US 10,957,573 B2
(45) Date of Patent: Mar. 23, 2021

(54) ELECTROSTATIC CHUCK DEVICE INCLUDING A HEATING MEMBER

(71) Applicant: SUMITOMO OSAKA CEMENT CO., LTD., Tokyo (JP)

(72) Inventors: Tomomi Ito, Tokyo (JP); Yukio Miura, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 311 days.

(21) Appl. No.: 16/073,506

(22) PCT Filed: Jan. 19, 2017

(86) PCT No.: PCT/JP2017/001703
§ 371 (c)(1),
(2) Date: Jul. 27, 2018

(87) PCT Pub. No.: WO2017/130827
PCT Pub. Date: Aug. 3, 2017

(65) Prior Publication Data
US 2019/0035668 A1    Jan. 31, 2019

(30) Foreign Application Priority Data
Jan. 29, 2016  (JP) .............................. JP2016-016021

(51) Int. Cl.
*H01L 21/687*  (2006.01)
*H01L 21/683*  (2006.01)
*H01L 21/67*   (2006.01)

(52) U.S. Cl.
CPC .... *H01L 21/6833* (2013.01); *H01L 21/67103* (2013.01); *H01L 21/67109* (2013.01); *H01L 21/6831* (2013.01); *H01L 21/68757* (2013.01)

(58) Field of Classification Search
CPC ......... H01L 21/67103; H01L 21/67109; H01L 21/6831; H01L 21/68757
See application file for complete search history.

(56) References Cited

U.S. PATENT DOCUMENTS 9,343,346 B2 * 5/2016 Kosakai ............ H01L 21/67103
2012/0299253 A1   11/2012 Kosakai et al.
(Continued)

FOREIGN PATENT DOCUMENTS

JP    2011-159684    8/2011
JP    2011-176275    9/2011
(Continued)

OTHER PUBLICATIONS

International Search Report issued in WIPO Patent Application No. PCT/JP2017/001703, dated Apr. 4, 2017 (with partial English-language translation).

*Primary Examiner* — Matthew V Nguyen
*Assistant Examiner* — Jye-June Lee
(74) *Attorney, Agent, or Firm* — Greenblum & Bernstein, P.L.C.

(57) ABSTRACT

An electrostatic chuck device includes: in order, an electrostatic chuck part having one principal surface serving as a placing surface on which a plate-shaped sample is placed, and having a built-in internal electrode for electrostatic attraction; a heating member bonded to a surface on the side opposite to the placing surface of the electrostatic chuck part in a pattern having gaps; a sheet material; and a base part having a function of cooling the electrostatic chuck part, in which a silicone resin sheet having a layer thickness of 10 μm or more and less than 200 μm and a Shore hardness (A) in a range of 10 to 70 is provided between the electrostatic chuck part and the heating member.

3 Claims, 2 Drawing Sheets (56) References Cited

U.S. PATENT DOCUMENTS

2014/0042716 A1*  2/2014  Miura .............. H01L 21/67103
                                                   279/128
2015/0003903 A1   1/2015  Newton

FOREIGN PATENT DOCUMENTS

| JP | 2013-074251 | 4/2013 |
| JP | 2014-207374 | 10/2014 |
| JP | 2015-029088 | 2/2015 |
| JP | 2015-207765 | 11/2015 |

\* cited by examiner

ELECTROSTATIC CHUCK DEVICE INCLUDING A HEATING MEMBER

TECHNICAL FIELD

The present invention relates to an electrostatic chuck device.

BACKGROUND ART

In a semiconductor manufacturing process, in the processing of a wafer, an electrostatic chuck device is used as a device for easily mounting and fixing the wafer on and to a sample stage and maintaining the wafer at a desired temperature.

Finer processing of the wafer is progressing according to higher integration and higher performance of a semiconductor element, and a plasma etching technique which is high in production efficiency and enables fine processing of a large area is frequently used. If the wafer fixed to the electrostatic chuck device is irradiated with plasma, the surface temperature of the wafer rises. Therefore, in order to suppress a rise in the surface temperature, the wafer is cooled from the lower side by circulating a cooling medium such as water in a base part of the electrostatic chuck device. However, at this time, due to unevenness of heat input to the wafer by plasma in the surface of the wafer, a temperature distribution occurs in the surface of the wafer. For example, a temperature tends to become high at a central part of the wafer and become low at an edge portion of the wafer.

For example, in an electrostatic chuck device in which an in-plane temperature distribution of a wafer is adjusted using gas such as helium, or an electrostatic chuck device in which a contact area between a wafer or the like and an attraction surface of an electrostatic chuck is adjusted, it is difficult to perform local temperature control.

Further, in an electrostatic chuck device with a heater function according to the related art, there is a case where cracks are generated in an electrostatic chuck part, a base part, or a heater itself due to rapid rise and fall in temperature of the heater, and thus there is a problem in which durability as an electrostatic chuck device is insufficient.

In order to solve such a problem, there is disclosed, for example, an electrostatic chuck device in which in a case of being applied to a treatment apparatus such as a plasma etching apparatus, it is possible to perform local temperature control of a plate-shaped sample such as a silicon wafer associated with plasma application by generating a local temperature distribution in the surface of the plate-shaped sample such as a silicon wafer (refer to, for example, Patent Literature No. 1).

CITATION LIST

Patent Literature

[Patent Literature No. 1] Japanese Laid-open Patent Publication No. 2011-159684

SUMMARY OF INVENTION

Technical Problem

In order to further suppress variation in the in-plane temperature of the wafer, it is required to further enhance in-plane temperature uniformity of the electrostatic chuck part to which the wafer is fixed.

The present invention has an object to provide an electrostatic chuck device in which resistance to a shape change and heat resistance of a silicone resin sheet which is interposed between an electrostatic chuck part and a heating member are excellent and in-plane temperature uniformity of the electrostatic chuck part is excellent, and a task thereof is to achieve the object.

Solution to Problem

Specific means for achieving the above object is as follows.

<1> An electrostatic chuck device including: in order, an electrostatic chuck part having one principal surface serving as a placing surface on which a plate-shaped sample is placed, and having a built-in internal electrode for electrostatic attraction; a heating member bonded to a surface on the side opposite to the placing surface of the electrostatic chuck part in a pattern having gaps; a sheet material; and a base part having a function of cooling the electrostatic chuck part, in which a silicone resin sheet having a layer thickness of 10 µm or more and less than 200 µm and a Shore hardness (A) in a range of 10 to 70 is provided between the electrostatic chuck part and the heating member.

<2> The electrostatic chuck device according to the above <1>, further including: an insulating material layer provided between the heating member and the base part.

<3> The electrostatic chuck device according to the above <1> or <2>, in which the sheet material contains anyone selected from the group consisting of a silicone-based elastomer and a fluorine-based elastomer.

Advantageous Effects of Invention

According to the present invention, an electrostatic chuck device is provided in which resistance to a shape change and heat resistance of a silicone resin sheet which is interposed between an electrostatic chuck part and a heating member are excellent and in-plane temperature uniformity of the electrostatic chuck part is excellent.

DESCRIPTION OF EMBODIMENTS

<Electrostatic Chuck Device>

An electrostatic chuck device according to the present invention includes: in order, an electrostatic chuck part having one principal surface serving as a placing surface on which a plate-shaped sample is placed, and having a built-in internal electrode for electrostatic attraction; a heating member bonded to a surface on the side opposite to the placing surface of the electrostatic chuck part in a pattern having gaps; a sheet material; and a base part having a function of cooling the electrostatic chuck part, in which a silicone resin sheet having a layer thickness of 10 μm or more and less than 200 μm and a Shore hardness (A) in a range of 10 to 70 is provided between the electrostatic chuck part and the heating member.

First, the stacked configuration of the electrostatic chuck part, the silicone resin sheet, the heating member, the sheet material, and the base part in the electrostatic chuck device according to the present invention will be described.

Figure 1:
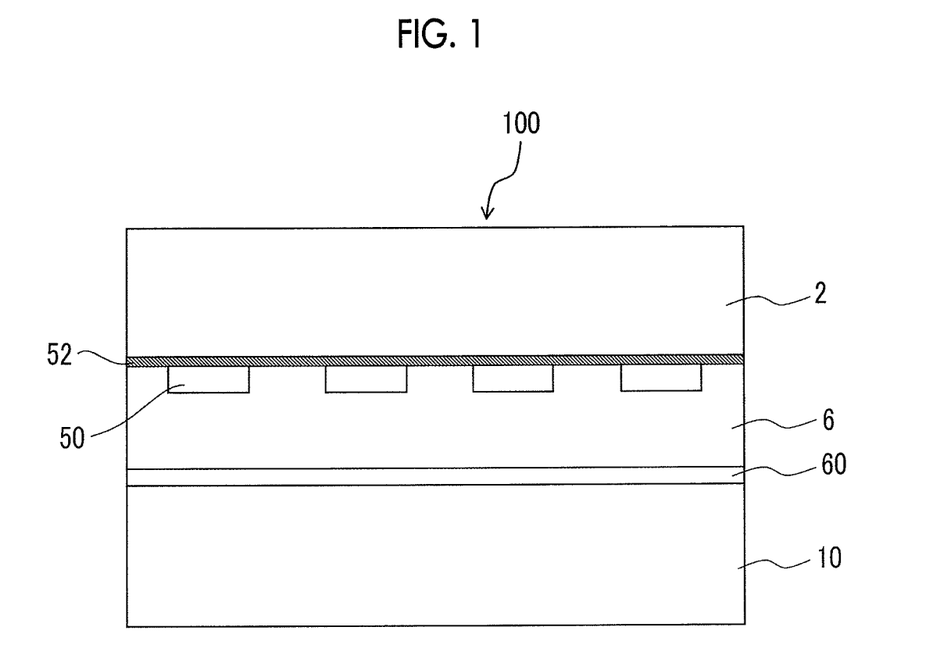
FIG. 1 is a schematic sectional view showing an example of a stacked configuration of an electrostatic chuck device according to the present invention.

FIG. 1 is a schematic sectional view showing an example of the stacked configuration of the electrostatic chuck device according to the present invention.

An electrostatic chuck device 100 has an electrostatic chuck part 2 to which a wafer is fixed, a heating member 50 which heats the electrostatic chuck part 2, a thick disk-shaped base part 10 having a function of cooling the electrostatic chuck part 2. A silicone resin sheet 52, the heating member 50, a sheet material 6, and an insulating material layer 60 in order from the electrostatic chuck part 2 side are provided between the electrostatic chuck part 2 and the base part 10.

Figure 2:
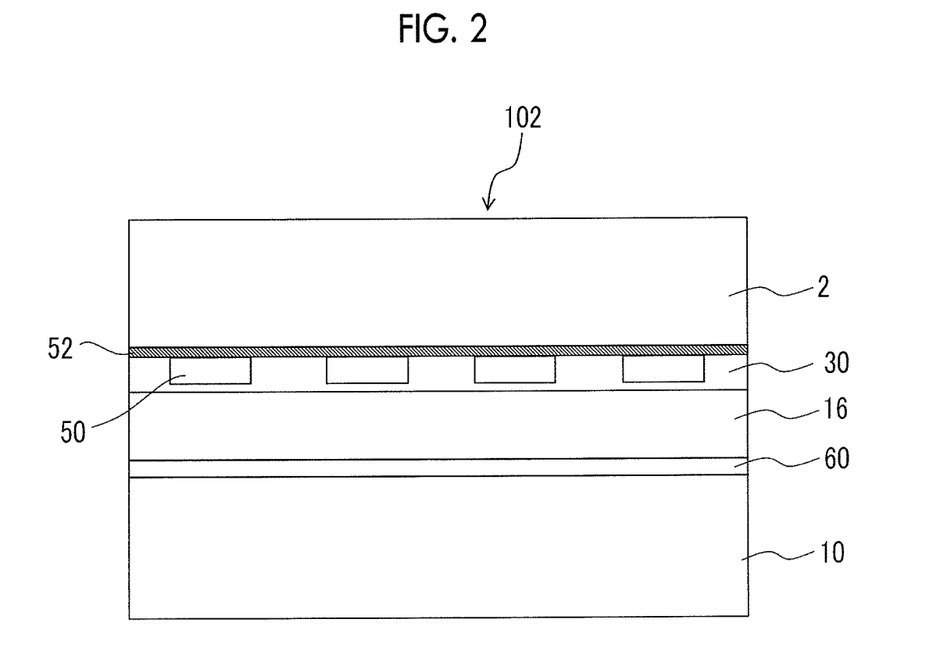
FIG. 2 is a schematic sectional view showing another example of the stacked configuration of the electrostatic chuck device according to the present invention.

FIG. 2 is a schematic sectional view showing another example of the stacked configuration of the electrostatic chuck device according to the present invention.

An electrostatic chuck device 102 has the electrostatic chuck part 2 to which a wafer is fixed, the heating member 50 which heats the electrostatic chuck part 2, and the thick disk-shaped base part 10 having a function of cooling the electrostatic chuck part 2. The silicone resin sheet 52, the heating member 50, a polymer material layer 30, a sheet material 16, and the insulating material layer 60 in order from the electrostatic chuck part 2 side are provided between the electrostatic chuck part 2 and the base part 10.

Figure 3:
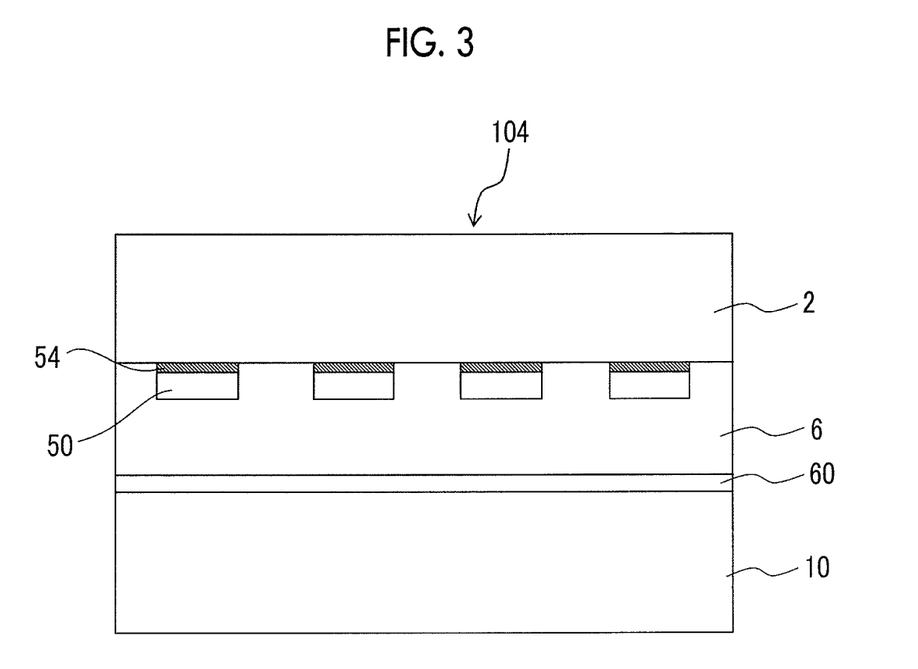
FIG. 3 is a schematic sectional view showing another example of the stacked configuration of the electrostatic chuck device according to the present invention.
Figure 4:
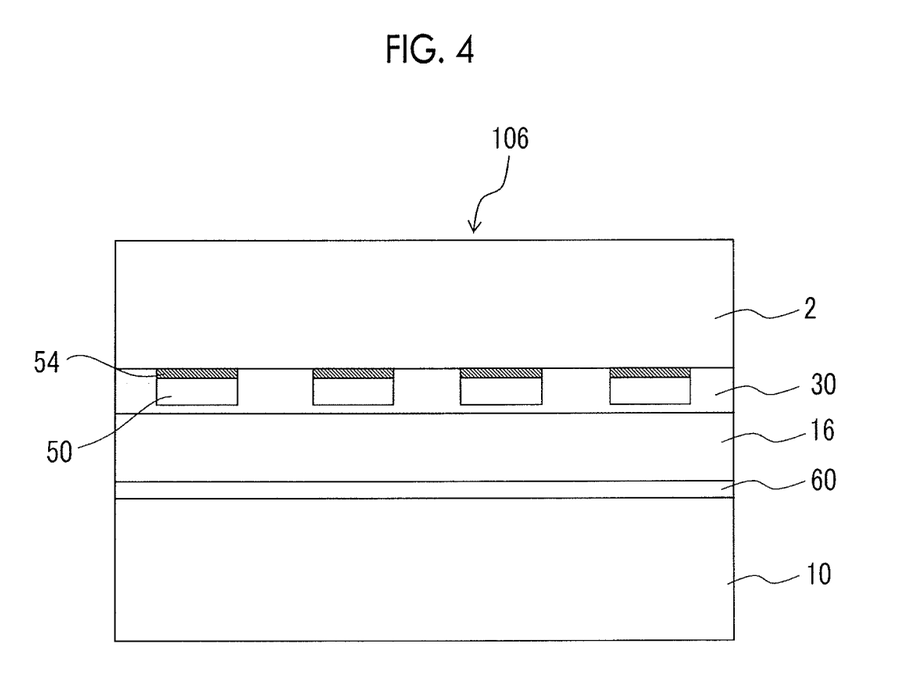
FIG. 4 is a schematic sectional view showing another example of the stacked configuration of the electrostatic chuck device according to the present invention.

FIGS. 3 and 4 are also schematic sectional views showing other examples of the stacked configuration of the electrostatic chuck device according to the present invention, and electrostatic chuck devices 104 and 106 of FIGS. 3 and 4 are the same as the electrostatic chuck devices of FIGS. 1 and 2, respectively, except that the form of a silicone resin sheet 54 is different from that of the silicone resin sheet 52. Constituent elements having the same reference numerals, for example, the electrostatic chuck part 2, the base part 10, and the like, have the same configurations in the electrostatic chuck devices 100, 102, 104, and 106, and preferred aspects thereof are also the same.

Hereinafter, except the silicone resin sheets 52 and 54, the electrostatic chuck devices 100 and 102 of FIGS. 1 and 2 will be described as representatives.

The heating member 50 is located on the surface (referred to as a heating member installation surface) on the side opposite to a placing surface of the electrostatic chuck part 2 with the silicone resin sheet 52 interposed therebetween, and is bonded to the electrostatic chuck part 2 in a pattern having gaps. The heating member 50 can be configured with, for example, one or a plurality of patterns formed by meandering a strip-shaped metal material having a narrow width. In FIGS. 1 and 2, four heating members 50 are shown. The heating members 50 are usually connected in one pattern. However, the heating members 50 may be configured with a plurality of patterns of the same type or different types. For example, a plurality of annular heating members having different diameters may be disposed concentrically.

The silicone resin sheet 52 may cover the whole of the heating member installation surface, as shown in FIGS. 1 and 2, or may be partially cover the heating member installation surface, as shown in FIGS. 3 and 4. As will be described later, the heating member 50 can be formed by removing a part of a plate-shaped metal member configuring the heating member by etching or the like. At this time, the silicone resin sheet 52 can also be removed together to form a layer of the silicone resin sheet 54 as shown in FIGS. 3 and 4. The silicone resin sheet 54 on the heating member installation surface between the heating member 50 and the heating member 50 is not entirely removed as shown in FIGS. 3 and 4, and the silicone resin sheet 54 may be provided on the heating member installation surface on which the heating member 50 is not present.

In the present invention, in a case of removing the resin sheet 52 by etching or the like, an etching solution which is used at the time of the etching enters from the bonding interface between the heating member 50 and the resin sheet 54, so that there is a possibility of damaging the heating member 50 and the resin sheet 54. Therefore, it is preferable that the silicone resin sheet 52 covers the whole of the heating member installation surface, as shown in FIGS. 1 and 2.

A sheet of a material having a low hardness is used as the sheet material 6 of FIG. 1, whereby at a location where the heating member 50 is present on the heating member installation surface of the electrostatic chuck part 2, the sheet material 6 is adjacent to the top of the heating member 50 or the side surface of the heating member 50, and at a location where the heating member 50 is not present, the sheet material 6 is adjacent to the electrostatic chuck part 2.

Although details of a method of manufacturing the electrostatic chuck device will be described later, the electrostatic chuck device can be manufactured by clamping and pressurizing the electrostatic chuck part 2 and the base part 10 with the sheet material 6 and, if necessary, the insulating material layer 60 interposed therebetween on the heating member installation surface side of the electrostatic chuck part 2, to which the heating member 50 is fixed. At this time, due to using a sheet having a low hardness as the sheet material 6, the sheet material 6 can bury the gap between the heating members 50 and fix the heating members 50 to the electrostatic chuck part 2.

As shown in FIG. 2, the gap between the heating members 50 can also be buried with the polymer material layer 30.

The polymer material layer 30 of FIG. 2 is adjacent to the top of the heating member 50 or the side surface of the heating member 50 at a location where the heating member 50 is present on the heating member installation surface of the electrostatic chuck part 2, and is adjacent to the electrostatic chuck part 2 at a location where the heating member 50 is not present. In FIG. 2, the polymer material layer 30 is also interposed between the heating member 50 and the sheet material 16, and the sheet material 16 is not in contact with the heating member 50. However, this configuration is merely one embodiment of the present invention. For example, a configuration may also be made in which the distance from the heating member installation surface of the electrostatic chuck part 2 to the surface on the base part 10 side of the heating member 50 aligns with the distance from the heating member installation surface of the electrostatic chuck part 2 to the surface on the base part 10 side of the polymer material layer 30, so that the sheet material 16 is in contact with both the heating member 50 and the polymer material layer 30.

As shown in FIG. 1, if the soft sheet material 6 is used, the constituent material of the electrostatic chuck device can be suppressed to a small amount. As shown in FIG. 2, if the polymer material layer 30 is used, even in a case where the sheet material 6 of FIG. 1 does not follow the shape of the gap between the heating members 50, the gap between the heating members 50 can be buried with the polymer material layer 30, so that the heating members 50 can be more reliably fixed.

Further, the electrostatic chuck device 100 of FIG. 1 has the insulating material layer 60 between the sheet material 6 and the base part 10. In FIG. 1, the insulating material layer 60 is provided at a position adjacent to the base part 10. However, the position of the insulating material layer 60 is not particularly limited, and for example, the insulating material layer 60 may be provided between the heating member 50 and the electrostatic chuck part 2, between the heating member 50 and the sheet material 6, or the like.

The electrostatic chuck device 102 of FIG. 2 has the insulating material layer 60 between the sheet material 16 and the base part 10. In FIG. 2, the insulating material layer 60 is provided at a position adjacent to the base part 10. However, the position of the insulating material layer 60 is not particularly limited, and for example, the insulating material layer 60 may be provided between the heating member 50 and the electrostatic chuck part 2, between the heating member 50 and the sheet material 16, or the like.

The stacked configuration of the electrostatic chuck device according to the present invention is not limited to the configurations shown in FIGS. 1 to 4.

Hereinafter, description will be made with the reference numerals in the drawings omitted.

[Silicone Resin Sheet]

The silicone resin sheet is a member which withstands deterioration and a shape change due to heating by the heating member and relaxes stress which is caused by a difference in temperature between the electrostatic chuck part and the heating member, and from such a viewpoint, as the silicone resin sheet, silicone resin having a layer thickness of 10 μm or more and less than 200 μm and a Shore hardness (A) in a range of 10 to 70 is used.

In the related art, an acrylic adhesive sheet, an epoxy adhesive sheet, or a silicone adhesive sheet has been used as a member for bonding the electrostatic chuck part and the heating member together. However, the acrylic adhesive sheet and the epoxy adhesive sheet are liable to deteriorate due to heating by the heating member, and it is difficult for the heat transfer from the heating member to the electrostatic chuck part to become uniform due to the shape change of the adhesive sheet. Further, the silicone adhesive sheet generally has a configuration in which silicone-based resin adhesive layers are provided on both sides of a support, and the adhesive layer is thin, so that the heat resistance is insufficient.

In contrast, the silicone resin sheet which is used in the present invention does not have an adhesion layer on the surface thereof and has a layer thickness of 10 μm or more and less than 200 μm, and therefore, it has excellent heat resistance and a shape change hardly occurs even if it is heated by the heating member. For this reason, it conducts the heat of the heating member to the electrostatic chuck part and in-plane temperature uniformity of the electrostatic chuck part is excellent.

It is preferable that the silicone resin sheet itself is also not an adhesive or sticky sheet, and specifically, it is preferable that the adhesive force of the silicone resin sheet at 25° C. and humidity of 50% RH is 0.1 N/25 mm or less. The adhesive force of an adhesive sheet, a sticky sheet, or the like generally is in a range of 5 to 10 N/25 mm (at 25° C. and humidity of 50% RH), although the adhesive force depends on an adhesive component and a sticky component. The adhesive force of the silicone resin sheet at 25° C. and humidity of 50% RH is can be measured based on the sticky tape/sticky sheet test method of JIS Z 0237 (2009).

The silicone resin sheet has a layer thickness of 10 μm or more and less than 200 μm. A silicone resin sheet having a layer thickness of less than 10 μm is not available. If the layer thickness is 200 μm or more, thermal conductivity to the electrostatic chuck part by the heating member is not excellent. The layer thickness of the silicone resin sheet is preferably in a range of 15 μm to 150 μm and more preferably in a range 20 μm to 100 μm.

The silicone resin sheet has a Shore hardness (A) (JIS Z 2246: 2000) in a range of 10 to 70. A silicone resin sheet having a Shore hardness (A) of less than 10 is not available, and a silicone resin sheet having a Shore hardness (A) exceeding 70 has poor conformability to the surface irregularities and has poor adhesion to a contact base material. The Shore hardness (A) of the silicone resin sheet is preferably in a range of 15 to 65 and more preferably in a range of 20 to 60.

It is preferable that the silicone resin sheet is soft not only before it is heated by the heating member but also after it is heated, and specifically, it is preferable that both the storage elastic modulus E' of the silicone resin sheet before it is heated at 180° C. for 1000 hours and the storage elastic modulus E' of the silicone resin sheet after it is heated at 180° C. for 1000 hours are in a range of 1 to 50 MPa in a temperature range of 0 to 200° C.

The storage elastic modulus E' of the silicone resin sheet can be measured based on the test method of plastic dynamic mechanical properties of JIS K 7244 (1999).

It is more preferable that the storage elastic modulus E' of the silicone resin sheet each of before heating at 180° C. for 1000 hours and after heating is in a range of 1 to 10 MPa in a temperature range of 0 to 200° C.

From the viewpoint of the heat conduction of the heating member and control of the Shore hardness (A), the silicone resin sheet may contain a filler in a proportion of 20% by mass or less with respect to the total mass of the silicone resin sheet. That is, the content of the filler in the silicone resin sheet is preferably in a range 0 to 20% by mass. The content of the filler in the silicone resin sheet is more preferably in a range of 0 to 10% by mass and further preferably in a range of 0 to 5% by mass.

The type of the filler is not particularly limited as long as it does not hinder the heat conduction of the heating member. However, it is preferable that the filler is an inorganic filler. As the inorganic filler, metal, a metal oxide, or a metal nitride can be given as an example, and among them, at least one type which is selected from the group consisting of silica, alumina, zirconia, and aluminum nitride is preferable, and at least one type which is selected from the group consisting of silica, alumina, and zirconia is more preferable.

In order to improve the adhesion to the heating member installation surface of the electrostatic chuck part and the heating member, the silicone resin sheet may be subjected to surface processing such as corona discharge treatment or plasma treatment and may be subjected to undercoating processing such as primer treatment. Details of the surface processing and the undercoating processing are described in "Polymer Surface Processing" (Akira Iwamori, published by Gihodo Shuppan Co., Ltd.), or the like.

As the silicone resin sheet, commercially available products may be used, and for example, "μ" series manufactured by Sanshin Enterprise Co., Ltd., "normal product", "high cleavage product" series or the like manufactured by Fuso Rubber Industry Co., Ltd. can be given.

[Sheet Material]

The sheet material is a member for relaxing stress which is caused by a difference in temperature between the electrostatic chuck part and the base part, and from such a viewpoint, it is preferable that the sheet material contains any one which is selected from the group consisting of a silicone-based elastomer and a fluorine-based elastomer.

As the silicone-based elastomer, an elastomer containing organopolysiloxane as its main component is used, and it is divided into a polydimethylsiloxane-based elastomer, a polymethylphenylsiloxane-based elastomer, and a polydiphenylsiloxane-based elastomer. There is also an elastomer partially denatured with a vinyl group, an alkoxy group, or the like. As a specific example, KE series (manufactured by Shin-Etsu Chemical Co., Ltd.), SE series, CY series, and SH series (all manufactured by Dow Corning Toray Silicone Co., Ltd.), or the like can be given.

As the fluorine-based elastomer, an elastomer having a structure in which a hard segment is fluorine-based resin and a soft segment is fluorine-based rubber, an elastomer in which the hydrogen atoms of some or all of hydrocarbon groups which are included in a silicone-based elastomer are substituted with fluorine atoms, or the like can be given as an example.

The sheet material may include the silicone-based elastomer or the fluorine-based elastomer independently, may include two or more types, or may include all of one or more types of silicone-based elastomers and one or more types of fluorine-based elastomers.

It is preferable that the thickness of the sheet material is in a range of 20 μm to 500 μm. The thickness of the sheet material is 20 μm or more, whereby it is easy to relax stress which is caused by a difference in temperature between the electrostatic chuck part and the base part. The thickness of the sheet material is 500 μm or less, whereby it is possible to suppress a decrease in the in-plane temperature uniformity of the electrostatic chuck part.

From the viewpoint of relaxing stress which is caused by a difference in temperature between the electrostatic chuck part and the base part, it is preferable that the Shore hardness (A) of the sheet material is in a range of 20 to 80.

[Electrostatic Chuck Part]

The electrostatic chuck part has one principal surface serving as a placing surface on which a plate-shaped sample is placed, and a built-in internal electrode for electrostatic attraction.

More specifically, for example, the electrostatic chuck part is preferably configured of a placing plate having an upper surface serving as a placing surface on which a plate-shaped sample such as a semiconductor wafer is placed, a supporting plate which is integrated with the placing plate and supports the placing plate, an internal electrode for electrostatic attraction and an insulating material layer (an in-chuck insulating material layer) for insulating the surroundings of the internal electrode for electrostatic attraction, which are provided between the placing plate and the supporting plate, and a power supply terminal which is provided so as to penetrate the supporting plate and applies a direct-current voltage to the internal electrode for electrostatic attraction.

In the electrostatic chuck part, the surface adjacent to a silicone resin sheet is the surface of a supporting plate of the electrostatic chuck part.

The placing plate and the supporting plate have disk shapes in which the shapes of the superimposed surfaces are the same, and it is preferable that each of the placing plate and the supporting plate is made of an insulating ceramic sintered compact having mechanical strength and having durability against corrosive gas and plasma thereof, such as an aluminum oxide-silicon carbide ($Al_2O_3$—SiC) compound sintered compact, an aluminum oxide ($Al_2O_3$) sintered compact, an aluminum nitride (AlN) sintered compact, or an yttrium oxide ($Y_2O_3$) sintered compact.

A configuration is preferable in which a plurality of protrusion portions each having a diameter smaller than the thickness of the plate-shaped sample are formed on the placing surface of the placing plate and the protrusion portions support the plate-shaped sample.

It is preferable that the thickness of the electrostatic chuck part (the total thickness of the placing plate and the supporting plate) is in a range of 0.7 mm to 5.0 mm. The thickness of the electrostatic chuck part is 0.7 mm or more, whereby it is possible to secure the mechanical strength of the electrostatic chuck part. The thickness of the electrostatic chuck part is 5.0 mm or less, whereby heat transfer in a lateral direction of the electrostatic chuck part does not easily increase and a predetermined in-plane temperature distribution is easily obtained. Therefore, heat capacity does not easily increase and a thermal responsiveness is not easily degraded. The lateral direction of the electrostatic chuck part refers to the direction orthogonal to a stacking direction in the stacked configuration of the electrostatic chuck part, the silicone resin sheet, the sheet material, and the base part, as shown in FIG. 1.

The internal electrode for electrostatic attraction is used as an electrode for an electrostatic chuck for generating electric charges and fixing the plate-shaped sample with an electrostatic attraction force, and the shape or the size thereof is appropriately adjusted according to a use thereof.

The internal electrode for electrostatic attraction is formed of conductive ceramics such as an aluminum oxide-tantalum carbide ($Al_2O_3$—$Ta_4C_5$) conductive compound sintered compact, an aluminum oxide-tungsten ($Al_2O_3$—W) conductive compound sintered compact, an aluminum oxide-silicon carbide ($Al_2O_3$—SiC) conductive compound sintered compact, an aluminum nitride-tungsten (AlN—W) conductive compound sintered compact, or an aluminum nitride-tantalum (AlN—Ta) conductive compound sintered compact, or high melting point metal such as tungsten (W), tantalum (Ta), or molybdenum (Mo).

The thickness of the internal electrode for electrostatic attraction is not particularly limited. However, the thickness of the internal electrode for electrostatic attraction is preferably in a range of 0.1 μm to 100 μm and more preferably in a range of 5 μm to 20 μm. The thickness of the internal electrode for electrostatic attraction is 0.1 μm or more, whereby it is possible to secure sufficient electrical conductivity. The thickness is 100 μm or less, whereby it is difficult for the difference in coefficient of thermal expansion between the placing plate and the supporting plate, and the internal electrode for electrostatic attraction, to become large, and it is difficult for cracking to occur in the joint interface between the placing plate and the supporting plate.

The internal electrode for electrostatic attraction having such a thickness can be easily formed by a film formation method such as a sputtering method or a vapor deposition method, or a coating method such as a screen printing method.

The in-chuck insulating material layer surrounds the internal electrode for electrostatic attraction to protect the internal electrode for electrostatic attraction from corrosive gas and plasma thereof, and joins and integrates a boundary portion between the placing plate and the supporting plate, that is, an outer peripheral portion region except for the internal electrode for electrostatic attraction. It is preferable that the in-chuck insulating material layer is configured of an insulating material having the same composition or the same main component as the materials configuring the placing plate and the supporting plate.

The power supply terminal is a rod-shaped member provided in order to apply a direct-current voltage to the internal electrode for electrostatic attraction. A material of the power supply terminal is not particularly limited as long as it is an electrically conductive material having excellent heat resistance. However, a material having a coefficient of thermal expansion close to the coefficients of thermal expansion of the internal electrode for electrostatic attraction and the supporting plate is preferable, and for example, conductive ceramics configuring the internal electrode for electrostatic attraction or a metal material such as tungsten (W), tantalum (Ta), molybdenum (Mo), niobium (Nb), or a Kovar alloy is suitably used.

It is preferable that the power supply terminal is insulated from the base part by an insulator having insulation properties.

Further, it is preferable that the power supply terminal is joined to and integrated with the supporting plate and the placing plate and the supporting plate are joined to and integrated with each other by the internal electrode for electrostatic attraction and the in-chuck insulating material layer, thereby configuring the electrostatic chuck part.

[Heating Member]

The heating member is located on the surface on the side opposite to the placing surface of the electrostatic chuck part and bonded to the electrostatic chuck part in a pattern having gaps with the silicone resin sheet interposed therebetween.

The form of the heating member is not particularly limited. However, it is preferable that the heating member is a heater element composed of two or more mutually independent heater patterns.

The heater element can be configured of, for example, two mutually independent heaters; an inner heater formed at a center portion of the surface (the heating member installation surface) on the side opposite to the placing surface of the electrostatic chuck part, and an outer heater annularly formed outside a peripheral edge portion of the inner heater. Each of the inner heater and the outer heater can have a single continuous strip-shaped heater pattern formed by repeatedly disposing a meandering pattern of a narrow strip-shaped metal material around the center axis of the heating member installation surface with the center axis as the center and connecting the patterns adjacent to each other.

By independently controlling each of the inner heater and the outer heater, it is possible to accurately control the in-plane temperature distribution of the plate-shaped sample fixed to the placing surface of the placing plate of the electrostatic chuck part by electrostatic attraction.

It is preferable that the heater element is formed by etching a nonmagnetic metal thin plate, for example, a titanium (Ti) thin plate, a tungsten (W) thin plate, a molybdenum (Mo) thin plate, or the like, having a constant thickness of preferably 0.2 mm or less and more preferably 0.1 mm or less, into a desired heater pattern by a photolithography method.

The thickness of the heater element is 0.2 mm or less, whereby it is difficult for the pattern shape of the heater element to be reflected as the temperature distribution of the plate-shaped sample and it becomes easy to maintain the in-plane temperature of the plate-shaped sample at a desired temperature pattern.

Further, if the heater element is formed of nonmagnetic metal, even if the electrostatic chuck device is used in a high-frequency atmosphere, it is difficult for the heater element to cause self-heating due to a high frequency and it becomes easy to maintain the in-plane temperature of the plate-shaped sample at a desired constant temperature or a desired constant temperature pattern.

Further, if the heater element is formed using a nonmagnetic metal thin plate having a constant thickness, the thickness of the heater element becomes constant over the entire heating surface and the amount of heat generation also becomes constant over the entire heating surface. Therefore, it is possible to make a temperature distribution in the placing surface of the electrostatic chuck part uniform.

[Polymer Material Layer]

The electrostatic chuck device may have a polymer material layer burying the gap between the heating members.

The layer thickness in the stacking direction of the electrostatic chuck device, of the polymer material layer which is located on the surface on which the heating member is not provided, in the surface (the heating member installation surface) on the side opposite to the placing surface of the electrostatic chuck part, is at least the same thickness as the shortest distance from the heating member installation surface to the surface of the heating member on the sheet material side. In a case where the surface of the heating member (the surface of the heating member on the sheet material side) is covered with the polymer material layer, the layer thickness of the polymer material layer on the surface of the heating member (the distance from the surface of the heating member installation surface to the surface of the heating member on the sheet material side) is preferably in a range of 1 μm to 100 μm and more preferably in a range of 1 μm to 25 μm, from the viewpoint of the in-plane temperature uniformity of the electrostatic chuck part.

As a polymer material capable of configuring the polymer material layer, heat-resistant resin such as polyimide resin, a silicone adhesive (silicone rubber), silicone resin, fluorine-based resin, room temperature vulcanizing (RTV) rubber, fluorine-based silicone rubber, or the like can be given as an example. Only one type of these may be used, or two or more types may be used.

Among them, from the viewpoint of heat resistance, the heat-resistant resin such as polyimide resin, the silicone adhesive, the fluorine-based resin, and the fluorine-based silicone rubber are preferable, and the polyimide resin, the silicone adhesive, and the fluorine-based resin are more preferable. Further, it is preferable that the silicone adhesive (silicone rubber) is in a liquid state.

[Insulating Material Layer]

It is preferable that the electrostatic chuck device has an insulating material layer which covers at least a part of the base part.

The electrostatic chuck device according to the present invention has the heating member which heats the electrostatic chuck part, and therefore, in order to suppress conduction (a short-circuit defect) between the electrostatic chuck part and the base part and improve the withstand voltage property of the base part, it is preferable that the electrostatic chuck device has an insulating material layer.

It is favorable if the insulating material layer covers at least a part of the base part. However, it is preferable that the insulating material layer is a film-shaped or sheet-shaped layer which covers the whole of the base part.

Further, it is favorable if the position of the insulating material layer is located between the electrostatic chuck part and the base part, and the insulating material layer may be configured in not only a single layer but also a plurality of layers. For example, the insulating material layer may be provided at a position adjacent to the base part, between the heating member and the electrostatic chuck part, between the heating member and the sheet material, or the like.

Among them, from the viewpoint of easiness of the formation of the insulating material layer, it is preferable that the insulating material layer is provided at a position adjacent to the base part between the heating member and the base part.

In a case of fixing the insulating material layer to the base part, it is preferable that the insulating material layer is fixed to the upper surface of the base part through an adhesive. The adhesive (an adhesive for the insulating material layer) which is used for the fixing of the insulating material layer is not particularly limited, and a sheet-shaped or film-shaped adhesive resin having heat resistance and insulation properties, such as polyimide resin, silicone resin, or epoxy resin, can be used. The thickness of the adhesive for the insulating material layer is preferably in a range of 5 µm to 100 µm and more preferably in a range of 10 µm to 50 µm. From the viewpoint of enhancing the in-plane uniformity of the temperature control of the electrostatic chuck part by the base part, it is preferable that variation in the in-plane thickness of the adhesive for the insulating material layer is within 10 µm.

From the viewpoint of temperature adjustment of the electrostatic chuck part, the thermal conductivity of the insulating material layer is preferably 0.05 W/mK or more and 0.5 W/mK or less and more preferably 0.1 W/mK or more and 0.25 W/mK or less.

[Base Part]

The base part is a member having a function of cooling the electrostatic chuck part and adjusting the temperature of the electrostatic chuck part heated by the heating member to a desired temperature, and also has a function of lowering heat generation caused by etching or the like of the plate-shaped sample fixed to the electrostatic chuck part.

The shape of the base part is not particularly limited. However, usually, it is a thick disk shape. It is preferable that the base part is a water-cooled base or the like, in which a flow path for circulating water is formed in the interior thereof.

As a material configuring the base part, metal which is excellent in thermal conductivity, electrical conductivity, and workability, a compound material which includes the metal, or ceramics can be given as an example. Specifically, for example, aluminum (Al), an aluminum alloy, copper (Cu), a copper alloy, stainless steel (SUS), or the like is suitably used. It is preferable that at least the surface which is exposed to plasma, of the base part, is subjected to alumite treatment or has an insulating film such as alumina formed thereon.

<Method of Manufacturing Electrostatic Chuck Device>

A method of manufacturing the electrostatic chuck device is not particularly limited as long as it is a method capable of forming the stacked configuration of the electrostatic chuck device according to the present invention. A method may be adopted in which the electrostatic chuck part, the silicone resin sheet, the heating member, the sheet material, and the base part are stacked in this order and the electrostatic chuck part and the base part are then clamped by being pressurized by a hot press or the like, and a method may be adopted in which an adhesive is interposed between the respective layers, so that the layers adjacent to each other are bonded to each other. In a case of using an adhesive, an adhesive sheet may be used, or a liquid adhesive may be used. However, from the viewpoint of reducing the layer thickness of an adhesion layer, it is preferable to use a coating solution (hereinafter referred to as a solution for adhesion) which includes an adhesive, water, and, if necessary, an organic solvent that dissolves the adhesive.

In the manufacture of the electrostatic chuck device, it is preferable that the heating member is fixed to the heating member installation surface of the electrostatic chuck part in advance with the silicone resin sheet. The surface of the silicone resin sheet is processed in advance by a known method, the heating member is then fixed to the heating member installation surface through the silicone resin sheet, and the soft sheet material is further pressure-bonded onto the heating member, so that the heating member is more firmly fixed to the heating member installation surface of the electrostatic chuck part.

Further, as in the electrostatic chuck device shown in FIG. 2, it is preferable that a recess portion formed by the electrostatic chuck part and the heating member is buried with a polymer material, so that the heights of the polymer material layer and the heating member are aligned with each other, or, it is preferable that the recess portion and the heating member are covered with a polymer material and the surface of the polymer material layer is flattened.

In a case where the electrostatic chuck device is provided with the insulating material layer, it is preferable that the insulating material layer is fixed to the base part with an adhesive (an adhesive for the insulating material layer).

In the heating member, one or a plurality of individual heating members may be fixed to the heating member installation surface with an interval therebetween, or, after a film-shaped or plate-shaped heating member is stuck to the heating member installation surface, a gap may be formed by removing a part of the heating member by etching or the like to expose the silicone resin sheet or the heating member installation surface.

At this time, it is preferable that the silicone resin sheet is left together with the heating member without being removed and the silicone resin sheet is exposed.

It is preferable that a solution for adhesion is applied to one side or both sides of the sheet material in advance. An electrostatic chuck device is obtained by clamping the sheet material with the solution for adhesion applied thereto between the electrostatic chuck part with the heating member and the base part and then pressurizing them with a hot press or the like.

When the insulating material layer is provided in the electrostatic chuck device, the solution for adhesion is applied to one side or both sides of an insulating material, and the sheet material with the solution for adhesion applied thereto and the insulating material with the solution for adhesion applied thereto are disposed at arbitrary positions and sandwiched between the electrostatic chuck part with the heating member and the base part, and then they are pressurized by a hot press or the like, whereby an electrostatic chuck device with an insulating material layer is obtained.

As the adhesive of the solution for adhesion, a known adhesive can be used, and various adhesives such as an acrylic adhesive, an epoxy adhesive, and a silicone adhesive can be used. The adhesive may be a commercially available product, and for example, as a silicone adhesive (including a silicone adhesive compound), a silicone adhesive compound (for example, SD 4580 PSA, SD 4584 PSA, SD 4585 PSA, SD 4587 L PSA, SD 4560 PSA, or the like) manufactured by Dow Corning Toray Co., Ltd., a silicone adhesive (for example, XE13-B3208, TSE3221, TSE3212S, TSE3261-G, TSE3280-G, TSE3281-G, TSE3221, TSE326, TSE326M, TSE325, or the like) manufactured by Momentive Performance Materials Inc., a silicone adhesive (for example, KE-1820, KE-1823, KE-1825, KE-1830, KE-1833, or the like) manufactured by Shin-Etsu Chemical Co., Ltd., or the like can be given as an example.

The solution for adhesion may contain an organic solvent that dissolves the adhesive. The organic solvent is not particularly limited as long as it can dissolve the adhesive, and for example, at least one type which is selected from the group consisting of alcohol and a ketone can be given. As alcohol, methanol, ethanol, isopropyl alcohol, or the like can be given as an example, and as ketone, acetone, methyl ethyl ketone, or the like can be given as an example.

From the viewpoint of uniform application in a thin film, it is preferable that the solution for adhesion is prepared in such a range that the concentration of the adhesive is in a range of 0.05% by mass to 5% by mass. It is more preferable that the concentration of the adhesive in the solution for adhesion is in a range of 0.1% by mass to 1% by mass.

Further, the solution for adhesion may include a catalyst in order to promote the hydrolysis of the adhesive. As the catalyst, a hydrochloric acid, a nitric acid, ammonia, or the like can be given as an example, and among them, a hydrochloric acid and ammonia are preferable.

From the viewpoint of suppressing remaining of the catalyst in the electrostatic chuck device, it is preferable that the solution for adhesion does not include a catalyst, and it is preferable that the solution for adhesion includes an adhesive in which a reactive functional group is an epoxy group, an isocyanate group, an amino group, or a mercapto group, as the adhesive.

Further, in the formation of the polymer material layer, it is preferable to use a solution for the polymer material layer, which includes a polymer material and a solvent that dissolves the polymer material.

As the solvent that dissolves the polymer material, although it depends on the type of the polymer material, methyl ethyl ketone, methyl isobutyl ketone, cyclohexanone, or the like can be given as an example, and for example, in a case where polyimide resin is used as the polymer material, it is preferable that methyl ethyl ketone is used as the solvent.

The concentration of the polymer material in the solution for the polymer material layer depends on the type of a polymer material which is used, a solution applying method, or the like. However, for example, in a case of application by spin coating, from the viewpoint of uniform application, the concentration is preferably in a range of 0.05% by mass to 5% by mass and more preferably in a range of 0.1% by mass to 1% by mass. Further, in a case where the application method is screen printing, from the viewpoint of easiness of printing, the concentration of the polymer material in the solution for the polymer material layer is preferably 30% by mass to 70% by mass and more preferably 40% by mass to 60% by mass %.

As a method of applying the solution for adhesion and the solution for the polymer material layer to the surface to be applied, in addition to application by screen printing and coating by spin coating, application with spray, a brush, or a bar coater, discharge by an inkjet method, or the like can be given as an example. After the application of the solution for adhesion and the solution for the polymer material layer, it is preferable to heat the surface to which the solution is applied, thereby removing the solvent. The heating of the surface to which the solution is applied is preferably performed at a temperature in a range of 80° C. to 120° C. for a time in a range of 30 seconds to 5 minutes, although it varies according to the thickness of the adhesive layer or the polymer material layer, the concentration and type of the adhesive or the polymer material in the solution, or the like.

Further, it is preferable that the electrostatic chuck part is manufactured as follows.

First, the plate-shaped placing plate and the plate-shaped supporting plate are fabricated by using an aluminum oxide-silicon carbide ($Al_2O_3$—SiC) compound sintered compact. In this case, each of the placing plate and the supporting plate can be obtained by forming mixed powder which includes silicon carbide powder and aluminum oxide powder into a desired shape and then performing calcination for a predetermined time at a temperature in a range of 1600° C. to 2000° C., for example, under a non-oxidative atmosphere, preferably, an inert atmosphere.

Subsequently, a plurality of fixing holes for fitting and holding the power supply terminals therein are formed in the supporting plate.

The power supply terminal is fabricated so as to have a size and a shape in which the power supply terminal can be fixed in close contact with the fixing hole of the supporting plate. As a method of fabricating the power supply terminal, for example, in a case where the power supply terminal is made of a conductive compound sintered compact, a method in which conductive ceramic powder is formed into a desired shape and pressurized and calcinated, or the like can be given as an example.

At this time, as the conductive ceramic powder which is used for the power supply terminal, conductive ceramic powder made of the same material as the internal electrode for electrostatic attraction is preferable.

Further, in a case where the power supply terminal is made of metal, a method in which high melting point metal is used and the power supply terminal is formed by a metal working method such as a grinding method or a powder metallurgy, or the like can be given as an example.

Subsequently, a layer for formation of the internal electrode for electrostatic attraction is formed by applying a coating liquid for formation of the internal electrode for electrostatic attraction, in which a conductive material such as the conductive ceramic powder described above is dispersed in an organic solvent which includes terpineol, ethyl cellulose, and the like, to a predetermined area of the surface of the supporting plate with the power supply terminals fitted therein, so as to come into contact with the power supply terminals, and drying the coating liquid.

As the application method, it is desirable to use a screen printing method or the like, because it is necessary to apply the coating liquid in a uniform thickness. Further, as other methods, there are a method of forming a thin film of the above-described high melting point metal by a vapor deposition method or a sputtering method, a method of forming the layer for formation of the internal electrode for electrostatic attraction by disposing a thin plate made of the above-described conductive ceramics or high melting point metal, and the like.

Further, the in-chuck insulating material layer which includes a powder material having the same composition or the same main component as the placing plate and the supporting plate is formed at an area except for the area in which the layer for formation of the internal electrode for electrostatic attraction is formed, on the supporting plate, in order to improve insulation properties, corrosion resistance, and plasma resistance. The in-chuck insulating material layer can be formed, for example, by applying a coating liquid in which insulating material powder having the same composition or the same main component as the placing plate and the supporting plate is dispersed in an organic solvent which includes terpineol, ethyl cellulose, and the like, to the predetermined area by screen printing or the like, and drying the coating liquid.

Subsequently, the placing plate is superimposed on the layer for formation of the internal electrode for electrostatic attraction and the insulating material on the supporting plate, and subsequently, these are integrated together by hot pressing work under a high temperature and high pressure. It is preferable that an atmosphere in this hot pressing work is vacuum or an inert atmosphere such as Ar, He, $N_2$, or the like. Further, the pressure is preferably in a range of 5 MPa to 10 MPa, and the temperature is preferably in a range of 1600° C. to 1850° C.

The layer for formation of the internal electrode for electrostatic attraction is calcinated by the hot pressing work, whereby the internal electrode for electrostatic attraction made of a conductive compound sintered compact is obtained. At the same time, the supporting plate and the placing plate are joined to and integrated with each other with the in-chuck insulating material layer interposed therebetween.

Further, the power supply terminals are re-calcinated by the hot pressing work under a high temperature and high pressure and fixed in close contact with the fixing holes of the supporting plate.

Then, the electrostatic chuck part is obtained by machining the upper and lower surfaces, the outer periphery, a gas hole, and the like of the joined body.

EXAMPLES

Hereinafter, the present invention will be described with reference to examples. However, the present invention is not limited to these examples.

In the following examples and comparative examples, a stacked body similar to the stacked configuration of the electrostatic chuck device shown in FIG. 1 was made and evaluated.

<1. Configurations of Stacked Bodies of Examples and Comparative Examples>

Each of the stacked bodies of the examples and some of the comparative examples has a configuration in which the electrostatic chuck part 2, the silicone resin sheet 52, the heating member 50, the sheet material 6, and the base part 10 in FIG. 1 are stacked in this order. However, the stacked bodies of the examples and the comparative examples do not have the insulating material layer 60 in FIG. 1. The stacked bodies of some of the comparative examples do not have the silicone resin sheet 52 as well.

<2. Manufacture of Stacked Body>

A test piece (the silicone resin sheet 52 or a sheet for comparison) having the type and physical properties shown in Table 1 was stacked on a ceramic plate ($Al_2O_3$—SiC compound sintered compact; the electrostatic chuck part 2), and subsequently, Ti foil (the heating member 50) was stacked thereon and then etched to expose a part of the test piece, so that a Ti pattern in which annular Ti foils having different diameters were disposed concentrically was formed.

The Shore hardness (A) of the test piece (the silicone resin sheet 52 or the sheet for comparison) was measured with Durometer GS-706 manufactured by Teclock Corp., and the thickness was measured with Film thickness meter VL-50A manufactured by Mitutoyo Corp.

A sheet material having a Shore hardness (A) of 50 and a layer thickness of 100 μm [Sμ-100-50 manufactured by Sanshin Enterprise Co., Ltd., the sheet material 6] was stacked on a ceramic plate having a concavo-convex surface formed by the Ti pattern, and an aluminum jig (diameter: 40 mm, thickness: 2 cm; the base part 10) was further stacked, and the ceramic plate and the aluminum jig were bonded together and heated at 100° C. for 3 minutes, whereby a stacked body was obtained.

<3. Evaluation Method>

The test pieces and the stacked bodies of the examples and the comparative examples were evaluated as follows. The results are shown in Table 1.

1. Heat Resistance Evaluation of Test Piece

After each test piece was cut into a dumbbell shape, a tensile strength test was carried out using the 5582 type universal material tester (manufactured by Instron Co.) by a method according to JIS K 6849. Thereafter, the test piece was heated at 180° C. for 1000 hours, and a tensile strength test was carried out by the same method. From the tensile strength F1 of the test piece before heating and the tensile strength F2 of the test piece after heating, a strength change Δ was calculated by the following expression, and evaluation was performed according to the following criteria.

$$\Delta(\%)=\{(F2-F1)/F1\}\times100$$

(Evaluation Criteria)

A: No change in strength before and after heating (Δ: within ±20%)

B: No change in strength before and after heating (Δ: −30% or more and less than −20%)

C: Slight decrease in strength after heating (Δ: −50% or more and less than −30%)

D: Decrease in strength after heating (Δ: less than −50%)

2. In-Plane Temperature Uniformity Evaluation by Shape Change Evaluation of Test Piece The total layer thicknesses at five places in each of the stacked bodies of the examples and the comparative examples were measured using Film thickness meter VL-50A manufactured by Mitutoyo Corp. Among the obtained measurement results, the difference between the layer thickness of the place having the largest layer thickness and the layer thickness of the place having the small layer thickness was set to be a film thickness fluctuation, and evaluation was performed according to the following criteria.

The film thickness fluctuation serves as an index of the shape change evaluation of the test piece and also serves as an index of the in-plane temperature uniformity of the wafer which is fixed to the electrostatic chuck device, and in a case where the film thickness fluctuation is less than 10 μm, the in-plane temperature uniformity of the electrostatic chuck part is excellent.

(Evaluation Criteria)

A: The film thickness fluctuation was less than 3 μm.

B: The film thickness fluctuation was 3 μm or more and less than 10 μm.

C: The film thickness fluctuation was 10 μm or more.

3. Internal Observation of Stacked Body

The interior of the stacked body was observed with an ultrasonic probe device IKK-1573A manufactured by Insight Co; Ltd., and subsequently, the interior of the stacked body was observed after the inside of the stacked body was heated at 180° C. for 1000 hours. From the adhesion area S1 of the test piece in the stacked body before heating and the adhesion area S2 of the test piece in the stacked body after heating, the peeled area of the test piece after heating was calculated by the following expression, and evaluation was performed according to the following criteria.

$$\text{Peeled area }(\%)=100-\{|S2-S1|/S1\}\times100$$

(Evaluation Criteria)

A: No peeled place (peeled area: 10% or less).

B: A little peeled place is present (peeled area: more than 10% and 20% or less).

C: A peeled place is present (peeled area: more than 20% and 30% or less).

D: Many peeled places are present (peeled area: more than 30%).

4. Measurement of Physical Properties of Test Piece

The coefficient of thermal expansion, the storage elastic modulus, and the break strength at room temperature (25° C.) of each of the test pieces of the examples and the comparative examples were measured using DMA-7100 manufactured by Hitachi High-Tech Science Corp. The results are shown in Table 1.

TABLE 1

| | Test piece | | | | | | Evaluation | | |
|---|---|---|---|---|---|---|---|---|---|
| | Type | Layer thickness (μm) | Shore hardness (A) | Coefficient of thermal expansion (1E–6/K) | Storage elastic modulus (MPa) | Break strength (MPa) | Heat resistance | Shape change (in-plane temperature uniformity) | Internal observation |
| Example 1 | Silicone resin sheet | 30 | 55 | 100 to 300 | 5 to 10 | 2.0 to 2.5 | A | A | A |
| Example 2 | Silicone resin sheet | 100 | 55 | 100 to 300 | 5 to 10 | 2.0 to 2.5 | A | A | A |
| Example 3 | Silicone resin sheet | 30 | 30 | 100 to 300 | 2 to 5 | 2.0 to 2.5 | A | A | A |
| Comparative Example 1 | Epoxy adhesive sheet | 30 | >80 | 70 | 500 to 1000 | 10 to 30 | D | A | A |
| Comparative Example 2 | Acrylic adhesive sheet | 30 | >80 | 50 to 100 | 50 to 100 | 5 to 10 | B | A | A |
| Comparative Example 3 | Polyimide sheet | 30 | >80 | 5 to 20 | 500 to 1000 | 10 to 30 | A | A | C |
| Comparative Example 4 | Silicone resin sheet | 200 | 55 | 100 to 300 | 5 to 10 | 2.0 to 2.5 | A | B | A |
| Comparative Example 5 | Silicone resin sheet | 30 | 80 | 100 to 300 | 10 to 20 | 2.0 to 2.5 | B | A | C |

As can be seen from Table 1, the sheet which is interposed between the electrostatic chuck part and the heating member is a silicone resin sheet having a layer thickness of 10 μm or more and less than 200 μm and a Shore hardness (A) in a range of 10 to 70, so that an electrostatic chuck device is obtained in which the resistance to a shape change and the heat resistance of the silicone resin sheet which is interposed between the electrostatic chuck part and the heating member are excellent and the in-plane temperature uniformity of the electrostatic chuck part is excellent.

REFERENCE SIGNS LIST

2: electrostatic chuck part
6: sheet material
10: base part
50: heating member
52: silicone resin sheet
60: insulating material layer
100: electrostatic chuck device

The invention claimed is:

1. An electrostatic chuck device comprising: in order,
an electrostatic chuck part having one principal surface serving as a placing surface on which a plate-shaped sample is placed, and having a built-in internal electrode for electrostatic attraction;
a heating member bonded to a surface on a side opposite to the placing surface of the electrostatic chuck part in a pattern having gaps;
a sheet material; and
a base part having a function of cooling the electrostatic chuck part,
wherein a silicone resin sheet having a layer thickness of 10 μm or more and less than 200 μm an adhesive force at 25° C. and humidity of 50% RH of 0.1 N/25 mm or less, and a Shore hardness (A) in a range of 10 to 70 is provided between the electrostatic chuck part and the heating member.

2. The electrostatic chuck device according to claim 1, further comprising:
an insulating material layer provided between the heating member and the base part.

3. The electrostatic chuck device according to claim 1, wherein the sheet material contains any one selected from a group consisting of a silicone-based elastomer and a fluorine-based elastomer.

* * * * *